United States Patent
Nayuki et al.

(10) Patent No.: US 12,121,993 B2
(45) Date of Patent: Oct. 22, 2024

(54) METHOD OF PROCESSING WORKPIECE AND LASER PROCESSING APPARATUS

(71) Applicant: DISCO CORPORATION, Tokyo (JP)

(72) Inventors: Masatoshi Nayuki, Tokyo (JP); Satoshi Kumazawa, Tokyo (JP); Keisuke Nishimoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 151 days.

(21) Appl. No.: 18/060,811

(22) Filed: Dec. 1, 2022

(65) Prior Publication Data
US 2023/0166355 A1 Jun. 1, 2023

(30) Foreign Application Priority Data
Dec. 1, 2021 (JP) .................. 2021-195723

(51) Int. Cl.
*B23K 26/20* (2014.01)
*B23K 26/70* (2014.01)
*B23K 101/18* (2006.01)
*B23K 101/40* (2006.01)
*H01L 21/683* (2006.01)
(Continued)

(52) U.S. Cl.
CPC ............ *B23K 26/20* (2013.01); *B23K 26/702* (2015.10); *B23K 2101/18* (2018.08); *B23K 2101/40* (2018.08); *H01L 21/6835* (2013.01); *H01L 21/6836* (2013.01); *H01L 21/78* (2013.01);
(Continued)

(58) Field of Classification Search
CPC . H01L 21/78; H01L 21/7806; H01L 21/7813; H01L 21/782; H01L 21/786; H01L 21/8256; H01L 21/8258; H01L 21/6835; H01L 21/6836; B23K 26/20; B23K 26/702
See application file for complete search history.

(56) References Cited

U.S. PATENT DOCUMENTS 8,912,075 B1 * 12/2014 Lei ..................... H01L 21/78
438/464
2006/0012020 A1 * 1/2006 Gilleo ................ H01L 25/0657
257/E21.705
(Continued)

FOREIGN PATENT DOCUMENTS

JP 2012253140 A 12/2012

*Primary Examiner* — Philip C Tucker
*Assistant Examiner* — Andrew L Swanson
(74) *Attorney, Agent, or Firm* — Greer Burns & Crain Ltd.

(57) ABSTRACT

A method of processing a plate-shaped workpiece includes a sheet affixing step of laying a thermocompression bonding sheet on a surface of the workpiece and heating and pressing the thermocompression bonding sheet against the workpiece to affix the thermocompression bonding sheet to the workpiece, a laser beam applying step of applying a laser beam having a wavelength absorbable by the workpiece to another surface of the workpiece along a projected dicing line established thereon, thereby processing the workpiece along the projected dicing line, and a sheet joining step of pressing the thermocompression bonding sheet while reheating the thermocompression bonding sheet to soften the same, so that the thermocompression bonding sheet is joined up by closing dividing grooves or through holes made in the thermocompression bonding sheet when the workpiece is processed in the laser beam applying step.

1 Claim, 6 Drawing Sheets

(51) Int. Cl.
    *H01L 21/78*     (2006.01)
    *H01L 21/782*    (2006.01)
    *H01L 21/784*    (2006.01)
    *H01L 21/82*     (2006.01)

(52) U.S. Cl.
    CPC .......... *H01L 21/782* (2013.01); *H01L 21/784* (2013.01); *H01L 21/82* (2013.01)

(56)                References Cited

U.S. PATENT DOCUMENTS

| | | | |
|---|---|---|---|
| 2016/0079118 A1* | 3/2016 | Ernst | H01L 21/78 |
| | | | 438/463 |
| 2018/0141163 A1* | 5/2018 | Wendt | B23K 26/0846 |
| 2020/0266102 A1* | 8/2020 | Harada | H01L 21/268 |

\* cited by examiner

METHOD OF PROCESSING WORKPIECE AND LASER PROCESSING APPARATUS

BACKGROUND OF THE INVENTION

Field of the Invention

The present invention relates to a method of processing a workpiece and a laser processing apparatus.

Description of the Related Art

There has been known in the art, as a process for dividing a workpiece such as a semiconductor wafer into device chips, a processing method of applying a laser beam to the wafer along projected dicing lines established thereon, to ablate the wafer. According to the processing method, it is general practice to hold the wafer that has been affixed to a dicing tape for better handling on a chuck table and to apply the laser beam to the wafer on the chuck table.

When the laser beam is applied to the wafer, the laser beam is also applied to portions of the dicing tape that extend beyond the wafer, i.e., on imaginary extensions of the projected dicing lines established on the wafer. Providing the laser beam is a short-pulse laser beam having high peak power or a middle-infrared laser bream having a high resin processing capability, the laser beam applied to the dicing tape may process the dicing tape to pierce or divide the dicing tape. If the dicing tape is thus damaged, the dicing tape may possibly be fused to the chuck table, contaminating the chuck table and making it difficult to remove the wafer from the chuck table. This problem can be solved by a method of stopping the laser beam from being applied within the wafer, thereby preventing the laser beam from being applied to the dicing tape (see JP 2012-253140A).

SUMMARY OF THE INVENTION

However, since the method disclosed in JP 2012-253140A tends to leave small portions unprocessed in the outer circumferential zone of the wafer, resulting in difficulties encountered in subsequent steps, such as wafer fragments scattered when the wafer is expanded, or adverse effects imposed on the subsequent steps when the workpiece is diced by a cutting blade.

It is therefore an object of the present invention to provide a method of processing a workpiece and a laser processing apparatus that are capable of processing a workpiece to which a dicing tape is affixed, with a laser beam having a high dicing tape processing capability, without imposing adverse effects on subsequent steps to be performed on the dicing tape.

In accordance with an aspect of the present invention, there is provided a method of processing a plate-shaped workpiece, including a sheet affixing step of laying a thermocompression bonding sheet on a surface of the workpiece and heating and pressing the thermocompression bonding sheet against the workpiece to affix the thermocompression bonding sheet to the workpiece, after the sheet affixing step, a laser beam applying step of applying a laser beam having a wavelength absorbable by the workpiece to another surface of the workpiece along a projected dicing line established thereon, thereby processing the workpiece along the projected dicing line, and after the laser beam applying step, a sheet joining step of pressing the thermocompression bonding sheet while reheating the thermocompression bonding sheet to soften the same, so that the thermocompression bonding sheet is joined up by closing dividing grooves or through holes made in the thermocompression bonding sheet when the workpiece is processed in the laser beam applying step.

In accordance with another aspect of the present invention, there is provided a laser processing apparatus for processing a plate-shaped workpiece, including a holding table having a holding surface for holding the workpiece with a thermocompression bonding sheet affixed to a surface thereof, a laser beam applying unit for focusing a laser beam having a wavelength absorbable by the workpiece and applying a focused spot of the laser beam to the workpiece held on the holding surface of the holding table, a heating unit for heating the thermocompression bonding sheet affixed to the workpiece, to soften the thermocompression bonding sheet, and a pressing unit for pressing the thermocompression bonding sheet that is heated by the heating unit, so that the thermocompression bonding sheet is joined up by closing dividing grooves or through holes made in the thermocompression bonding sheet when the workpiece is processed by the laser beam applying unit.

Preferably, the pressing unit is disposed in facing relation to the holding surface of the holding table, and is actuatable to press at least an outer circumferential edge of the workpiece and the thermocompression bonding sheet.

According to the present invention, a workpiece to which a thermocompression bonding sheet is affixed as a dicing tape can be processed by a laser beam having a high dicing tape processing capability, without imposing adverse effects on subsequent steps to be performed on the thermocompression bonding sheet.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

A preferred embodiment of the present invention will be described hereinbelow with reference to the accompanying drawings. The present invention is not limited to the details of the embodiment described below. The components described below cover those which could easily be anticipated by those skilled in the art and those which are essentially identical to those described above. Further, the arrangements described below can be combined in appropriate manners. Various omissions, replacements, or changes of the arrangements may be made without departing from the scope of the present invention.

Figure 1:
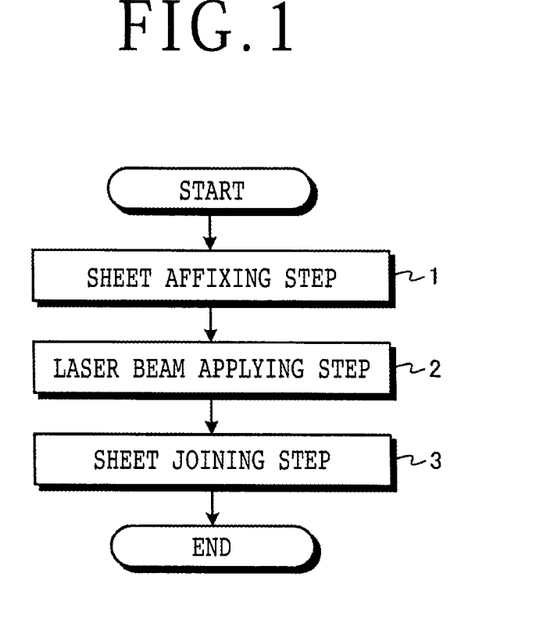
FIG. 1 is a flowchart of a sequence of a method of processing a workpiece according to an embodiment of the present invention.

A method of processing a workpiece and a laser processing apparatus according to the present embodiment will be described below with reference to the drawings. FIG. 1 illustrates a sequence of the method of processing a workpiece according to the present embodiment. As illustrated in FIG. 1, the method includes a sheet affixing step 1, a laser beam applying step 2, and a sheet joining step 3.

Figure 2:
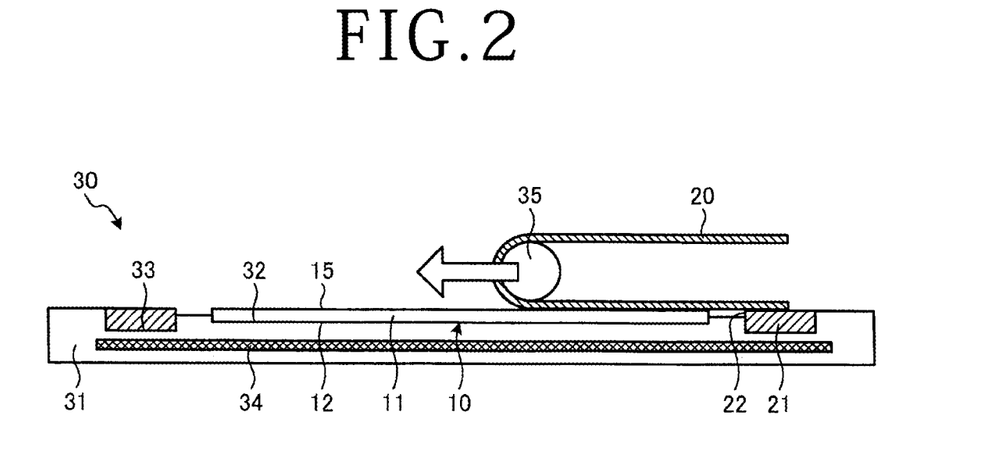
FIG. 2 is a cross-sectional view of an example of a sheet affixing step illustrated in FIG. 1.
Figure 4:
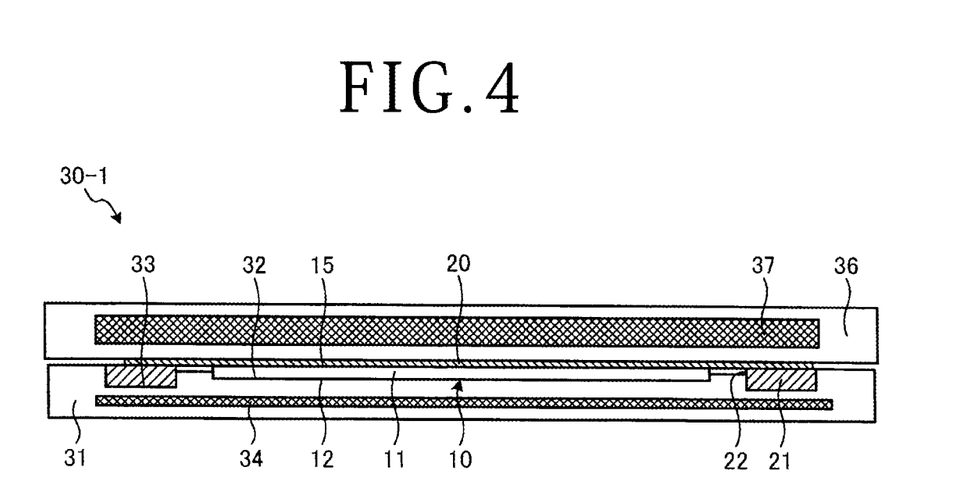
FIG. 4 is a cross-sectional view of another example of the sheet affixing step illustrated in FIG. 1.

The sheet affixing step 1 of the method according to the present embodiment is carried out by a sheet affixing unit 30 illustrated in FIG. 2 or a sheet affixing unit 30-1 illustrated in FIG. 4. The laser beam applying step 2 and the sheet joining step 3 according to the present embodiment are carried out by a laser processing apparatus 40 illustrated in FIGS. 5 through 9. The laser processing apparatus 40 includes a holding table 50, a heating unit 60, a laser beam applying unit 70, an image capturing unit 80, and a pressing unit 90. The sheet affixing units 30 and 30-1 may be incorporated in the laser processing apparatus 40.

(Sheet Affixing Step 1)

Figure 3:
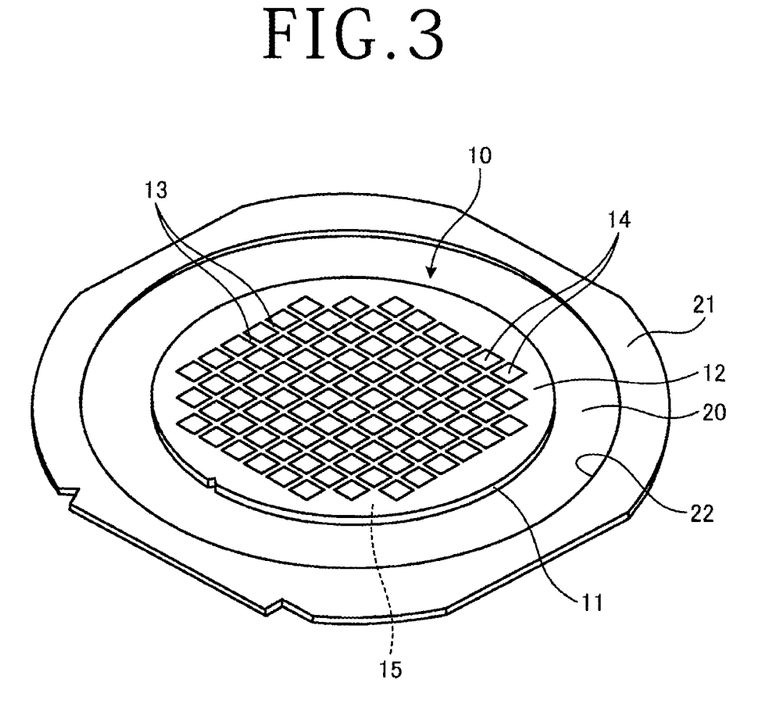
FIG. 3 is a perspective view of a workpiece that has been processed in the sheet affixing step illustrated in FIG. 1.

FIG. 2 illustrates in perspective an example of the sheet affixing step 1 illustrated in FIG. 1. FIG. 3 illustrates in perspective a workpiece 10 that has been processed in the sheet affixing step 1 illustrated in FIG. 1. The sheet affixing step 1 is a step of affixing a thermocompression bonding sheet 20 as a dicing tape to the workpiece 10 by laying the thermocompression bonding sheet 20 on one surface of the workpiece 10 and heating and pressing the thermocompression bonding sheet 20 against the workpiece 10.

The workpiece 10 is plate-shaped. According to the present embodiment, the workpiece 10 is a wafer such as a circular semiconductor wafer made of silicon (Si), sapphire (Al$_2$O$_3$), gallium arsenide (GaAs), silicon carbide (SiC), or the like or an optical wafer, for example. As illustrated in FIG. 3, the workpiece 10 has a plurality of projected dicing lines 13 established in a grid pattern on a face side 12 of a substrate 11 and a plurality of devices 14 constructed in respective areas demarcated on the face side 12 by the projected dicing lines 13.

Each of the devices 14 is, for example, an integrated circuit component such as an integrated circuit (IC) or a large-scale-integration (LSI) circuit, an image sensor such as a charge-coupled-device (CCD) image sensor or a complementary-metal-oxide-semiconductor (CMOS) image sensor, a micro-electromechanical-systems (MEMS) device, or the like. The workpiece 10 may have surface irregularities such as a plurality of bumps as protrusions on the face sides of the devices 14. Those surface irregularities may be made even by the thermocompression bonding sheet 20 that is thermally pressed against and bonded to the face side 12 of the substrate 11.

The substrate 11 of the workpiece 10 has a reverse side 15 positioned opposite the face side 12 on which the devices 14 are constructed. The reverse side 15 of the substrate 11 is ground by a grinding apparatus, for example, until the workpiece 10 is thinned down to a finished thickness. After the workpiece 10 has been thinned down, it is divided along the projected dicing lines 13 into individual device chips by cutting or the like. The device chips are of a square shape as illustrated in FIG. 3, though they may be of a rectangular shape.

The thermocompression bonding sheet 20 is a sheet of thermoplastic resin. The thermocompression bonding sheet 20 is pliable, non-adhesive, and thermoplastic, and does not have an adhesive glue layer. According to the present embodiment, the thermocompression bonding sheet 20 is made of resin that is transparent or semitransparent to visible light. According to the present embodiment, further, the thermocompression bonding sheet 20 is a sheet of polymer synthesized from alkene as a monomer. For example, the thermoplastic resin includes polyethylene, polypropylene, polystyrene, or the like.

In the sheet affixing step 1 according to the present embodiment, the thermocompression bonding sheet 20 is thermally pressed against and bonded to the reverse side 15 of the substrate 11 and an upper surface of an annular frame 21, integrally combining the workpiece 10 and the annular frame 21 with the thermocompression bonding sheet 20 interposed therebetween. The annular frame 21 is of an annular shape having an opening 22 whose diameter is larger than the diameter of the workpiece 10, as viewed in plan. The workpiece 10 is accommodated in the opening 22 of the annular frame 21. The annular frame 21 is made of a material such as metal or resin. According to the present embodiment, the thermocompression bonding sheet 20 is described as being thermally pressed against and bonded to the reverse side 15 of the substrate 11. According to the present invention, the thermocompression bonding sheet 20 may be thermally pressed against and bonded to the face side 12 of the substrate 11.

The sheet affixing step 1 according to the present embodiment is carried out by a sheet affixing unit 30 illustrated in FIG. 2. As illustrated in FIG. 2, the sheet affixing unit 30 has a holding table 31, a heating unit 34, and a pressing roller 35. The holding table 31 is a heat table that houses the heating unit 34 having a heat source.

The holding table 31 has recesses 32 and 33 defined in an upper surface thereof. The recess 32 is of a circular shape complementary to the contour of the workpiece 1, as viewed in plan. The recess 32 receives the workpiece 10 therein and holds and positions the face side 12 of the substrate 11 on an upwardly facing bottom surface thereof. The recess 33 is of an annular shape that is disposed radially outwardly of the recess 32 and that extends along the contour of the annular frame 21, as viewed in plan. The recess 33 receives the annular frame 21 therein and holds and positions a lower surface of the annular frame 21 on an upwardly facing bottom surface thereof.

The heating unit 34 including the heat source is accommodated in the holding table 31, and heats the workpiece 10 and the annular frame 21 that are placed respectively in the recesses 32 and 33. The pressing roller 35 is of a cylindrical shape whose longitudinal axis extends horizontally, and can roll from one end to the other of the holding table 31 while rotating about its longitudinal axis with the thermocompression bonding sheet 20 trained therearound. When the pressing roller 35 rolls from one end to the other of the holding table 31, it presses the thermocompression bonding sheet 20 progressively against the workpiece 10 and the annular frame 21 that are supported on the holding table 31.

In the sheet affixing step 1 illustrated in FIG. 2, the thermocompression bonding sheet 20 is prepared as a flat circular sheet whose planar shape is larger than the opening 22 of the annular frame 21. Then, the heat source of the heating unit 34 is energized to heat the holding table 31 to a predetermined temperature.

Next, while the reverse side 15 of the substrate 11 is facing upwardly, the workpiece 10 is positioned in the recess 32 in the holding table 31, and the annular frame 21 is positioned in the recess 33. With the workpiece 10 being positioned and accommodated in the opening 22 in the annular frame 21, the face side 12 of the substrate 11 and the lower surface of the annular frame 21 are heated by the heating unit 34.

Then, the pressing roller 35 is placed on an end of the holding table 31 with the thermocompression bonding sheet 20 interposed therebetween. Then, the pressing roller 35 is caused to roll on the reverse side 15 of the substrate 11 in the direction indicated by an arrow in FIG. 2 from one end to the other of the holding table 31. The pressing roller 35 now presses and spreads the thermocompression bonding sheet 20 against the reverse side 15 of the substrate 11, thereby thermally bonding the thermocompression bonding sheet 20 to the workpiece 10 and the annular frame 21 under pressure.

In the sheet affixing step 1 according to the embodiment illustrated in FIG. 2, therefore, the pressing roller 35 presses the thermocompression bonding sheet 20 to thermally bond the thermocompression bonding sheet 20 under pressure to the workpiece 10 while the holding table 31 housing the heating unit 34 therein is heating the workpiece 10 through the face side 12 thereof and the annular frame 21 through the lower surface thereof. The thermocompression bonding sheet 20 is thus pressed against and bonded to the reverse side 15 of the substrate 11 and the upper surface of the annular frame 21, so that the workpiece 10 and the annular frame 21 are integrally combined with each other by the thermocompression bonding sheet 20.

When the thermocompression bonding sheet 20 is thermally pressed against and bonded to the workpiece 10 and the annular frame 21 by the pressing roller 35, the thermocompression bonding sheet 20 should preferably be heated to a temperature that is equal to or higher than its softening point and equal to or lower than its melting point. In the sheet affixing step 1 according to the present embodiment, the pressing roller 35 may be a heat roller with a heat source housed therein, so that the pressing roller 35 may press the thermocompression bonding sheet 20 while the thermocompression bonding sheet 20 is being heated through its opposite surfaces by both the pressing roller 35 and the holding table 31. The pressing roller 35 may have its surface coated with a layer of fluororesin.

FIG. 4 illustrates in cross section another example of the sheet affixing step 1 illustrated in FIG. 1. The sheet affixing unit 30-1 illustrated in FIG. 4 has a pressing plate 36 and a heating unit 37 instead of the pressing roller 35 of the sheet affixing unit 30 illustrated in FIG. 2.

The pressing plate 36 has a flat lower surface facing the recesses 32 and 33 in the holding table 31, and is vertically movable toward and away from the holding table 31. The heating unit 37 has a heat source housed in the pressing plate 36, and, when energized, heats the thermocompression bonding sheet 20 while the thermocompression bonding sheet 20 is being pressed by the pressing plate 36. While the heating unit 37 is being energized, the pressing plate 36 presses the thermocompression bonding sheet 20 placed on the workpiece 10 and the annular frame 21 that are supported on the holding table 31 against the workpiece 10 and the annular frame 21, thereby bonding the thermocompression bonding sheet 20 to the workpiece 10 and the annular frame 21.

In the sheet affixing step 1 illustrated in FIG. 4, the thermocompression bonding sheet 20 is prepared as a flat circular sheet whose planar shape is larger than the opening 22 of the annular frame 21. Then, while the pressing plate 36 is being spaced from the holding table 31, the heat source of the heating unit 34 is energized to heat the holding table 31 to a predetermined temperature, and the heat source of the heating unit 37 is energized to heat the pressing plate 36 to a predetermined temperature.

Next, while the reverse side 15 of the substrate 11 is facing upwardly, the workpiece 10 is positioned in the recess 32 in the holding table 31, and the annular frame 21 is positioned in the recess 33. With the workpiece 10 being positioned and accommodated in the opening 22 in the annular frame 21, the face side 12 of the substrate 11 and the lower surface of the annular frame 21 are heated by the heating unit 34. Moreover, the thermocompression bonding sheet 20 is placed in covering relation to the reverse side 15 of the substrate 11 and the upper surface of the annular frame 21. Therefore, the thermocompression bonding sheet 20 is heated through the workpiece 10 and the annular frame 21.

Then, the pressing plate 36 is lowered to press the thermocompression bonding sheet 20. The pressing plate 36 now presses and spreads the thermocompression bonding sheet 20 against the reverse side 15 of the substrate 11, thereby thermally bonding the thermocompression bonding sheet 20 to the workpiece 10 and the annular frame 21 under pressure.

In the sheet affixing step 1 illustrated in FIG. 4, therefore, the workpiece 10 is heated through the reverse side 15 thereof and the annular frame 21 is heated through the lower surface thereof by the holding table 31 with the heat source of the heating unit 34 housed therein, and the thermocompression bonding sheet 20 is heated through the upper surface thereof by the pressing plate 36 with the heat source of the heating unit 37 housed therein. Stated otherwise, the pressing plate 36 presses the thermocompression bonding sheet 20 to bond the thermocompression bonding sheet 20 to the reverse side 15 of the substrate 11 and the upper surface of the annular frame 21 while heating the thermocompression bonding sheet 20 through its opposite surfaces. Therefore, the lower surface of the thermocompression bonding sheet 20, and the reverse side 15 of the substrate 11 and the upper surface of the annular frame 21 are pressed against and bonded to each other, so that the workpiece 10 and the annular frame 21 are integrally combined with each other by the thermocompression bonding sheet 20.

After the thermocompression bonding sheet 20 has been thermally pressed against and bonded to the workpiece 10 and the annular frame 21, the workpiece 10 that is supported on the annular frame 21 by the thermocompression bonding sheet 20 is removed from the sheet affixing unit 30. On a production line that processes a plurality of workpieces 10 one after another, the heating source of the heating unit 34 is not de-energized, but remains energized to thermally press and bond a succession of thermocompression bonding sheets 20 to respective sets of workpieces 10 and annular frames 21. The thermocompression bonding sheets 20 that have been bonded are cooled on their own during their removal from the holding table 31 on the production line.

(Laser Beam Applying Step 2)

Figure 5:
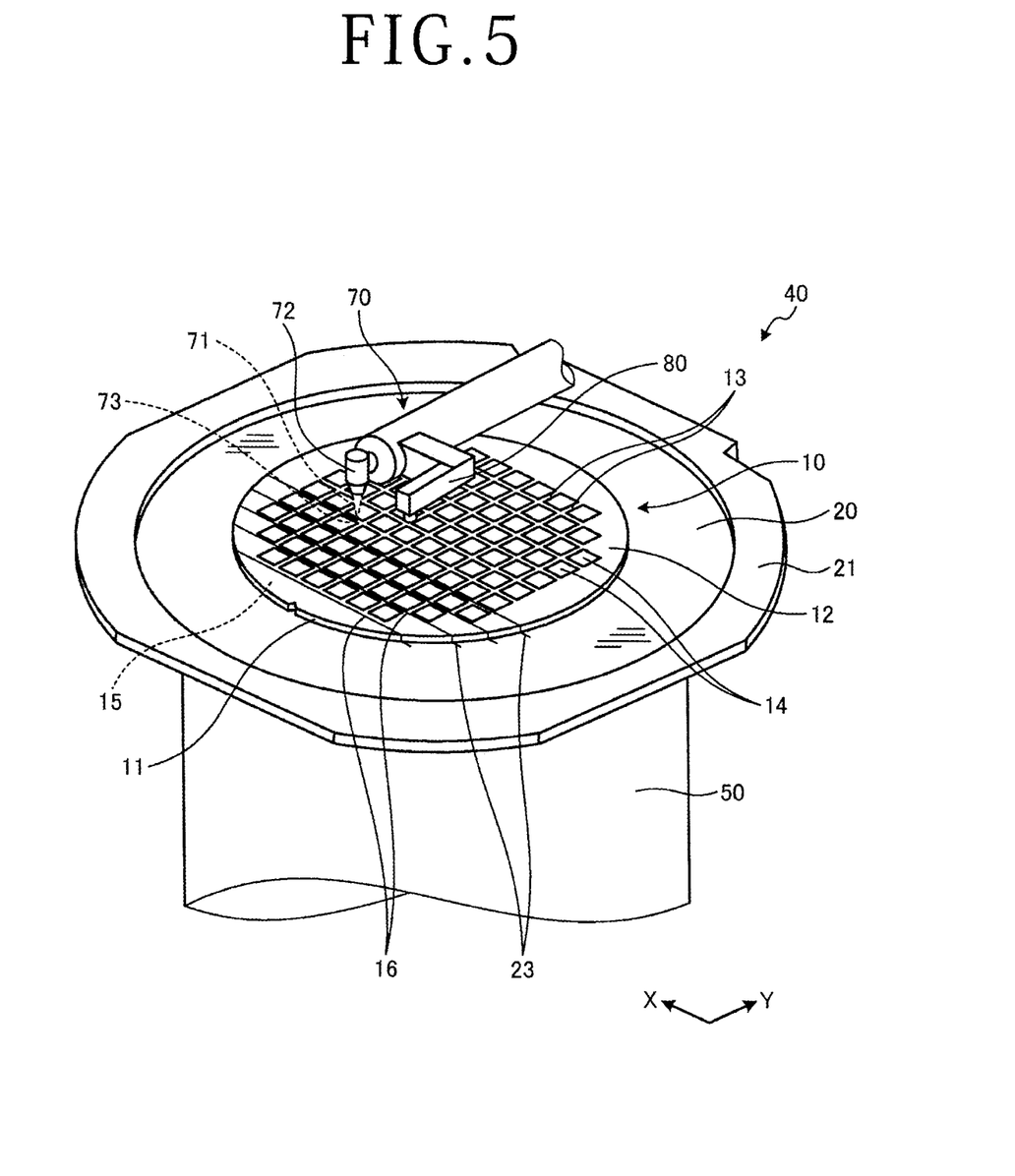
FIG. 5 is a perspective view of an example of a laser beam applying step illustrated in FIG. 1.
Figure 6:
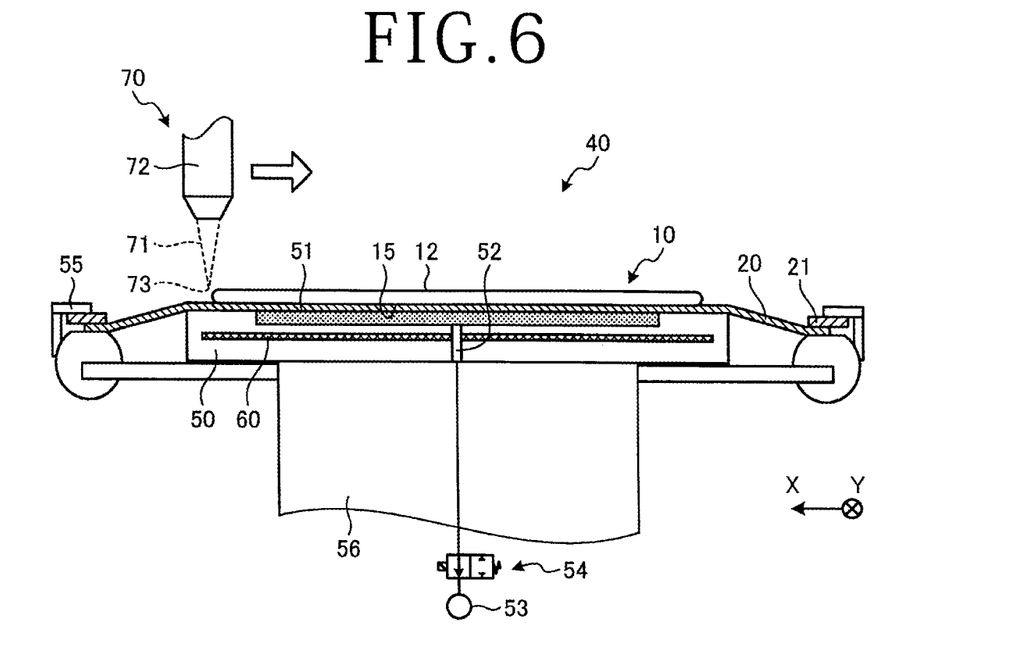
FIG. 6 is a cross-sectional view of the workpiece that has not yet been processed in the laser beam applying step illustrated in FIG. 1.
Figure 7:
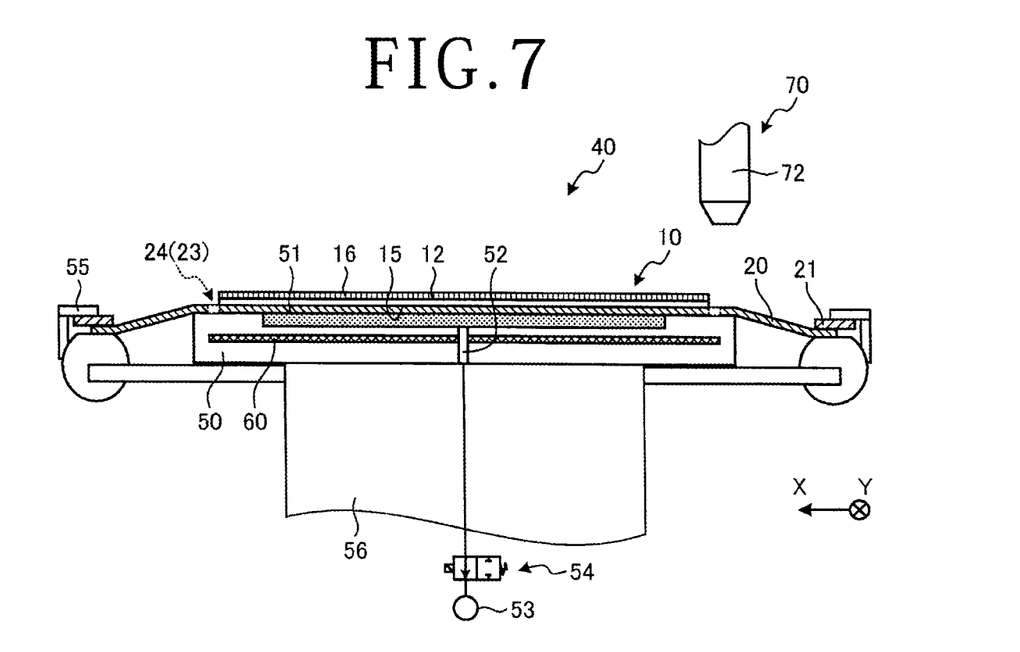
FIG. 7 is a cross-sectional view of the workpiece that has been processed in the laser beam applying step illustrated in FIG. 1.

FIG. 5 illustrates in perspective an example of the laser beam applying step 2 illustrated in FIG. 1. FIG. 6 illustrates in cross section the workpiece 10 that has not yet been processed in the laser beam applying step 2 illustrated in FIG. 1. FIG. 7 illustrates in cross section the workpiece 10 that has been processed in the laser beam applying step 2 illustrated in FIG. 1. The laser beam applying step 2 is a step of applying a pulsed laser beam 71 having a wavelength absorbable by the workpiece 10 to the face side 12 of the substrate 11 along the projected dicing lines 13 established thereon, thereby processing the workpiece 10.

In the laser beam applying step 2 according to the present embodiment, the laser beam applying unit 70 of the laser processing apparatus 40 applies the laser beam 71 to the workpiece 10 through the face side 12 while the reverse side 15 of the substrate 11 is being held on the holding table 50.

The holding table 50 holds the workpiece 10 on a holding surface 51 as an upper surface thereof. According to the present embodiment, the holding table 50 holds the reverse side 15 of the workpiece 10 through the thermocompression bonding sheet 20 affixed thereto. The holding surface 51 is shaped as a circular plate made of porous ceramic or the like. According to the present embodiment, the holding surface 51 is a flat surface lying parallel to horizontal directions.

The holding surface 51 is fluidly connected to a vacuum suction source 53 through a vacuum suction channel 52 in the holding table 50. A solenoid-operated valve 54 is connected between the vacuum suction channel 52 and the vacuum suction source 53. When the vacuum suction source 53 is actuated and the solenoid-operated valve 54 is opened, the holding table 50 holds the reverse side 15 of the substrate 11 under suction on the holding surface 51 with the thermocompression bonding sheet 20 interposed therebetween. Disposed around the holding table 50 are a plurality of clamps 55 for clamping the annular frame 21 that supports the workpiece 10 through the thermocompression bonding sheet 20, thereby securely keeping the workpiece 10 on the holding table 50.

The holding table 50 is rotatable about a vertical central axis by a rotating unit 56. The holding table 50 is movable relatively to the laser beam applying unit 70 by a moving unit, not illustrated, and is also movable relatively to a pressing unit 90, to be described later, by a moving unit, not illustrated. In the description that follows, an X-axis direction represents a direction in a horizontal plane, and a Y-axis direction represents a direction perpendicular to the X-axis direction in the horizontal plane. According to the present embodiment, the X-axis direction also represents a processing feed direction, whereas the Y-axis direction also represents an indexing feed direction.

The holding table 50 houses therein a heat source of the heating unit 60. The heat source of the heating unit 60 heats the holding surface 51 of the holding table 50 to a predetermined temperature, thereby heating and softening the thermocompression bonding sheet 20 affixed to the workpiece 10 placed on the holding surface 51.

The laser beam applying unit 70 is a unit for focusing and applying the laser beam 71 whose wavelength is absorbable by the workpiece 10 to the workpiece 10 held on the holding surface 51 of the holding table 50. The laser beam applying unit 70 includes, for example, a laser oscillator for emitting the laser beam 71, a beam condenser 72, and various optical components disposed in the optical path of the laser beam 71 between the laser oscillator and the beam condenser 72. The beam condenser 72 focuses the laser beam 71 emitted from the laser oscillator and propagated by the various optical components, into a focused spot 73 (see FIG. 6), and applies the focused spot 73 to the workpiece 10 held on the holding table 50.

According to the present embodiment, the image capturing unit 80 is fixed to the laser beam applying unit 70 at a position adjacent to the beam condenser 72. The image capturing unit 80 captures an image of the workpiece 10 held on the holding table 50. The image capturing unit 80 includes a CCD camera or an infrared camera for capturing an image of the workpiece 10 held on the holding table 50. The image capturing unit 80 captures an image of the workpiece 10 in order to perform an alignment process for positioning the workpiece 10 and the laser beam applying unit 70 with respect to each other, and outputs the captured image to a controller of the laser processing apparatus 40.

In the laser beam applying step 2, the reverse side 15 of the workpiece 10 is held under suction on the holding surface 51 of the holding table 50 with the thermocompression bonding sheet 20 interposed therebetween. Then, the moving unit, not illustrated, moves the holding table 50 to a processing position below the laser beam applying unit 70. Next, the image capturing unit 80 captures an image of the workpiece 10, and the controller detects one of the projected dicing lines 13 on the workpiece 10 from the captured image. The controller then performs the alignment process to align the detected projected dicing line 13 with the beam condenser 72 of the laser beam applying unit 70.

In the laser beam applying step 2, then, while the moving unit is moving the holding table 50 relatively to the laser beam applying unit 70 to keep the projected dicing line 13 in alignment with the beam condenser 72, the laser beam applying unit 70 applies the pulsed laser beam 71 to the face side 12 of the workpiece 10 while positioning the focused spot 73 on the face side 12. The laser beam 71 has its wavelength absorbable by the workpiece 10. As the beam condenser 72 is aligned with the projected dicing line 13 during the movement of the holding table 50 with respect to the laser beam applying unit 70, the beam condenser 72 applies the laser beam 71 along the projected dicing line 13, thereby creating a processed slot 16 (see FIG. 7) in the workpiece 10 along the projected dicing line 13.

In the laser beam applying step 2, at this time, the laser beam applying unit 70 applies the laser beam 71 to positions slightly outside of an outer circumferential edge of the workpiece 10 along the projected dicing line 13, so that the workpiece 10 is fully processed across the outer circumferential edge thereof with the laser beam 71 without leaving the outer circumferential edge unprocessed. Since the laser beam 71 is applied to the thermocompression bonding sheet 20 on hypothetical outward extensions of the projected dicing line 13, the laser beam 71 makes dividing grooves 23 in the thermocompression bonding sheet 20 with through holes 24 piercing the thermocompression bonding sheet 20 partly in the dividing grooves 23.

(Sheet Joining Step 3)

Figure 8:
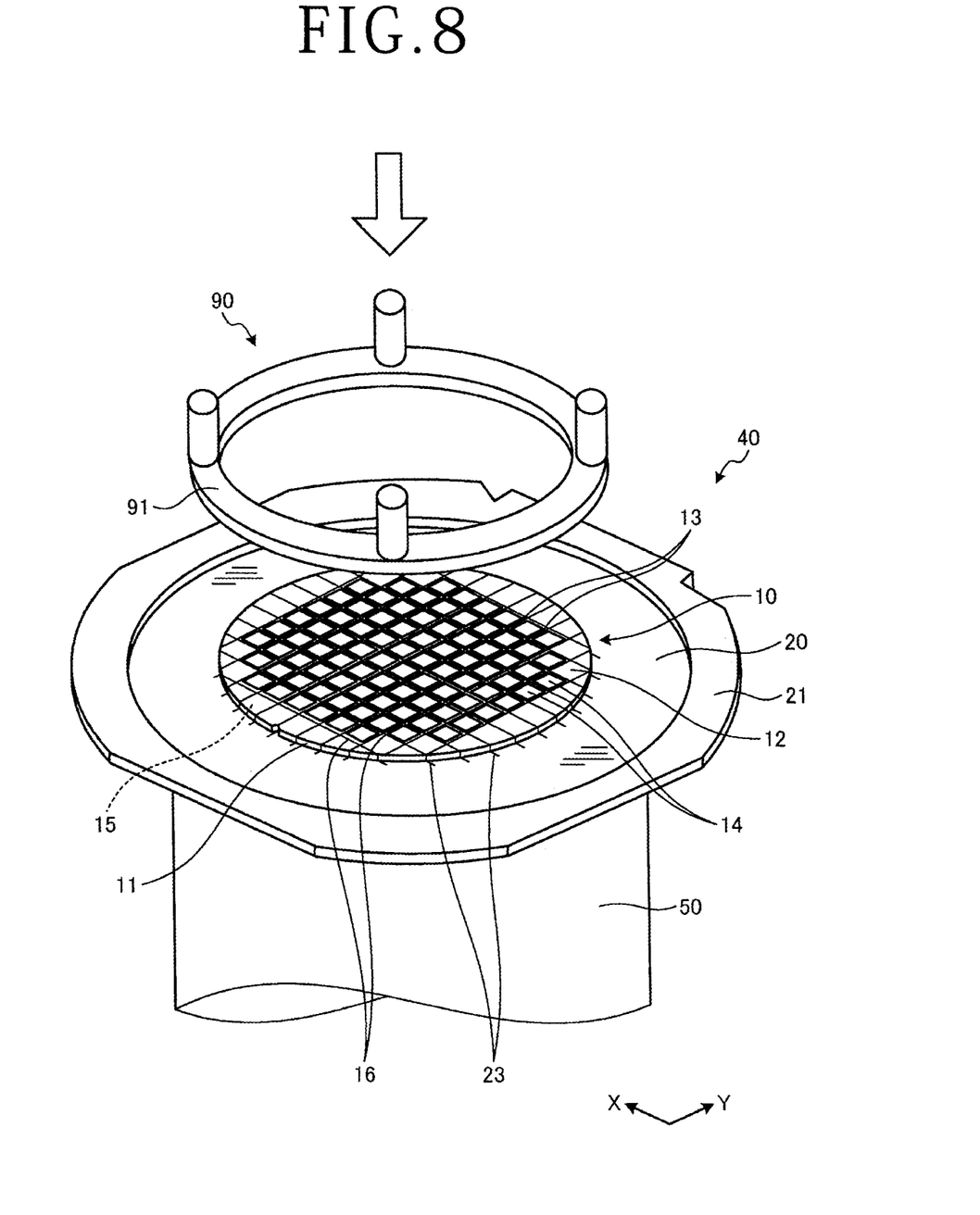
FIG. 8 is a perspective view of an example of a sheet joining step illustrated in FIG. 1.
Figure 9:
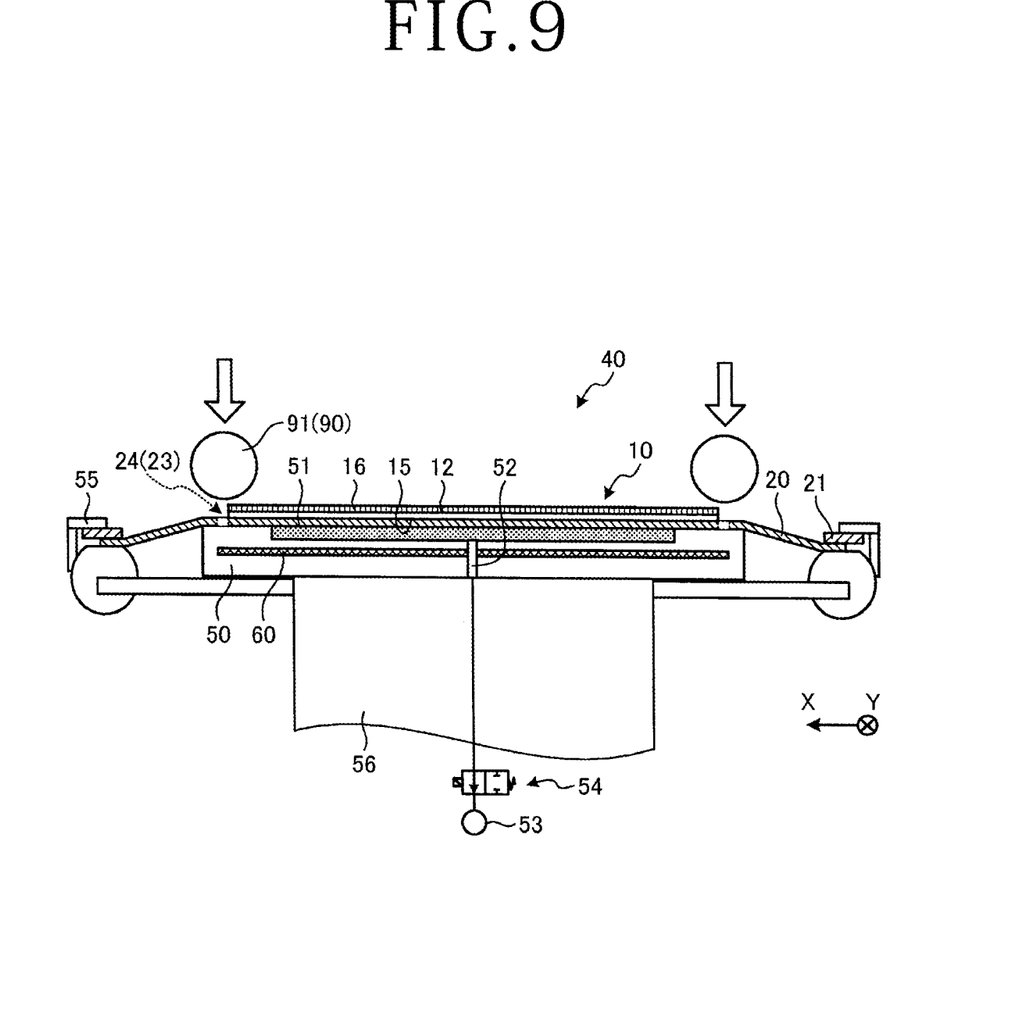
FIG. 9 is a cross-sectional view of the workpiece in the sheet joining step illustrated in FIG. 1.

FIG. 8 illustrates in perspective an example of the sheet joining step 3 illustrated in FIG. 1. FIG. 9 illustrates in cross section the workpiece 10 being processed in the sheet joining step 3 illustrated in FIG. 1. The sheet joining step 3 is a step of pressing the thermocompression bonding sheet 20 while reheating the thermocompression bonding sheet 20 to soften the same.

In the sheet joining step 3 according to the present embodiment, the thermocompression bonding sheet 20 processed together with the workpiece 10 in the laser beam applying step 2 and held on the holding table 50 is heated and softened by the heating unit 60, and pressed by the pressing unit 90 of the laser processing apparatus 40.

The pressing unit 90 is a unit for pressing the thermocompression bonding sheet 20 that is heated by the heating unit 60. The pressing unit 90 includes a presser 91 made of an elastic material. According to the present embodiment, the presser 91 is vertically movable toward and away from the holding table 50. According to the present embodiment, the presser 91 is of an annular shape having an outside diameter larger than the diameter of the workpiece 10 and an inside diameter smaller than the diameter of the workpiece 10, as viewed in plan.

In the sheet joining step 3, the moving unit, not illustrated, moves the holding table 50 to a position facing the presser 91 of the pressing unit 90. More specifically, the moving unit moves the holding table 50 to a position where the outer circumferential edge of the workpiece 10 is placed directly below the annular presser 91 in facing relation thereto. Then, while the presser 91 is being spaced from the holding table 50, the heat source of the heating unit 60 is energized to heat the holding table 50 to a predetermined temperature. The thermocompression bonding sheet 20 is now heated through its lower surface and softened.

Next, the presser 91 is lowered to contact and press the outer circumferential edge of the workpiece 10 downwardly. Therefore, the portion of the thermocompression bonding sheet 20 that corresponds to the outer circumferential edge of the workpiece 10 is pressed through the workpiece 10 by the presser 91. The thermocompression bonding sheet 20 that has been heated and softened by the heating unit 60 is spread planewise, i.e., in all directions along its plane, by being pressed. Inasmuch as the thermocompression bonding sheet 20 is spread in directions to close the dividing grooves 23 or the through holes 24 made in the thermocompression bonding sheet 20 in the laser beam applying step 2, the dividing grooves 23 or the through holes 24 have their peripheral edges coming closely to each other until the dividing grooves 23 or the through holes 24 are closed.

In the sheet joining step 3, as described above, the pressing unit 90 presses the thermocompression bonding sheet 20 while the heat source of the heating unit 60 housed in the holding table 50 is reheating the thermocompression bonding sheet 20 through its lower surface. The dividing grooves 23 or the through holes 24 made in the thermocompression bonding sheet 20 in the laser beam applying step 2 are thus closed, so that the thermocompression bonding sheet 20 is joined up in its entirety.

After the thermocompression bonding sheet 20 has been joined up, the presser 91 is lifted, and the workpiece 10 that is supported on the annular frame 21 by the thermocompression bonding sheet 20 is removed from the laser processing apparatus 40.

As described above, the method of processing the workpiece 10 and the laser processing apparatus 40 according to the present embodiment use the thermoplastic thermocompression bonding sheet 20 as a dicing tape that holds the workpiece 10 thereon. Even if the through holes 24 are made in the portion of the thermocompression bonding sheet 20 outside of the outer circumferential edge of the workpiece 10 or that portion of the thermocompression bonding sheet 20 sticks to the holding table 50 when the laser beam 71 is applied to the workpiece 10, the thermocompression bonding sheet 20 is joined up by being heated and pressed and restores its original state. Therefore, the holding table 50 is prevented from being unduly contaminated, and the thermocompression bonding sheet 20 can be processed by the laser beam 71 that has a high dicing tape processing capability, without imposing adverse effects on subsequent steps to be performed on the thermocompression bonding sheet 20.

The present invention is not limited to the above embodiment. Various changes and modifications may be made therein without departing from the scope of the present invention.

For example, according to the present embodiment, the heating unit 60 for heating the thermocompression bonding sheet 20 in the sheet joining step 3 has its heat source housed in the holding table 50. According to the present invention, however, the heat source may heat the presser 91 of the pressing unit 90. According to the present embodiment, the presser 91 is of an annular shape along the outer circumferential edge of the workpiece 10. According to the present invention, however, the presser 91 may be of a circular shape larger than the workpiece 10. Alternatively, the presser 91 may be a pressing roller for rolling on the upper surface, i.e., the face side 12 according to the present embodiment, of the workpiece 10.

In the sheet affixing step 1, according to the present embodiment, the thermocompression bonding sheet 20 is prepared as a flat circular sheet. According to the present invention, however, a quadrangular thermocompression bonding sheet may be affixed to the workpiece 10 and the annular frame 21 and then may be cut to a circular shape. According to such a modification, the portion of the quadrangular thermocompression bonding sheet that extends outside of the outer circumferential edge of the workpiece 10 is cut off by a cutter or the like.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A method of processing a plate-shaped workpiece, the method comprising:
a sheet affixing step of laying a thermocompression bonding sheet on a surface of the workpiece and heating and pressing the thermocompression bonding sheet against the workpiece to affix the thermocompression bonding sheet to the workpiece;
after the sheet affixing step, a laser beam applying step of applying a laser beam having a wavelength absorbable by the workpiece to another surface of the workpiece along a projected dicing line established thereon, thereby processing the workpiece along the projected dicing line; and
after the laser beam applying step, a sheet joining step of pressing the thermocompression bonding sheet while reheating the thermocompression bonding sheet to soften the same, so that the thermocompression bonding sheet is joined up by closing dividing grooves or through holes made in the thermocompression bonding sheet when the workpiece is processed in the laser beam applying step.

* * * * *